United States Patent [19]
Batra et al.

[11] Patent Number: 6,127,242
[45] Date of Patent: *Oct. 3, 2000

[54] METHOD FOR SEMICONDUCTOR DEVICE ISOLATION USING OXYGEN AND NITROGEN ION IMPLANTATIONS TO REDUCE LATERAL ENCROACHMENT

[75] Inventors: Shubneesh Batra; Jeff Honeycutt, both of Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/328,302

[22] Filed: Oct. 24, 1994

Related U.S. Application Data

[63] Continuation-in-part of application No. 08/195,524, Feb. 10, 1994, abandoned.

[51] Int. Cl.⁷ .................................................. H01L 21/76
[52] U.S. Cl. ........................... 438/440; 438/439; 438/297
[58] Field of Search ................ 437/69, 61, 70; 438/439, 440, 449, 297, 298

[56] References Cited

U.S. PATENT DOCUMENTS

| | | | |
|---|---|---|---|
| 4,541,167 | 9/1985 | Havemann et al. | 29/576 W |
| 4,587,709 | 5/1986 | Fowler et al. | 438/229 |
| 4,728,619 | 3/1988 | Pfiester et al. | 437/34 |
| 4,743,563 | 5/1988 | Pfiester et al. | 437/24 |
| 4,748,134 | 5/1988 | Holland et al. | 437/62 |
| 4,912,062 | 3/1990 | Verma | 437/69 |
| 4,920,076 | 4/1990 | Holland et al. | 437/238 |
| 4,957,873 | 9/1990 | Ojha et al. | 437/20 |

(List continued on next page.)

FOREIGN PATENT DOCUMENTS

| | | | |
|---|---|---|---|
| 0111243 | 9/1981 | Japan | 437/26 |
| 0115547 | 9/1981 | Japan | 437/69 |
| 57-79642 | 5/1982 | Japan . | |
| 0 076 147 A2 | 9/1982 | Japan . | |
| 58-50753 | 3/1983 | Japan . | |
| 0133740 | 7/1985 | Japan . | |
| 61-71350 | 4/1986 | Japan . | |
| 0228652 | 10/1986 | Japan | 437/69 |

(List continued on next page.)

OTHER PUBLICATIONS

Wolf, "Silicon Processing For The VLSI Era", Lattice Press, pp. 20–32, 1990.

Badawi, M.H. and Anand, K.V., A Study of Silicon Oxides Prepared by Oxygen Implantation into Silicon, J. Phys. D: Appl. Phys., vol. 10, pp. 1931–1942, 1977.

Dylewski, J. and Joski, M.C., Formation of Thin $SiO_2$ Films by High Dose Oxygen Ion Implantation into Silicon and Their Investigation by IR Techniques, Thin Solid Films, pp. 327–336, 1976.

Yu et al., New Bird's Beak–Free Device Isolation Technology, J. Electrochem. Soc., pp. 2562–2566, Oct. 1988.

R.L. Guldi et al., Characterization of Poly–Buffered LOCOS in Manufacturing Environment, J. Electrochemical Society, vol. 136, No. 12, Dec. 1989, pp. 3815–3819.

S.S. Roth et al., Polisilicon Encapsulated Local Oxidatio, IEEE EDL, vol. 12, No. 3, Mar. 1991, pp. 92–94.

(List continued on next page.)

*Primary Examiner*—Trung Dang
*Attorney, Agent, or Firm*—Schwegman, Lundberg, Woessner & Kluth, P.A.

[57] ABSTRACT

The invention is a method to form a localized oxide isolation region by implantation of oxygen and nitrogen ions prior to a thermal oxide growth. In accordance with one embodiment of the invention, a silicon substrate is selectively masked with silicon nitride and oxygen ions are implanted into the unmasked regions of the substrate at an energy necessary to form a buried oxygen rich layer close to the substrate surface. The nitrogen ions are implanted at an angle such that they underlie the masked regions adjacent to the unmasked regions. The substrate is then oxidized to form silicon oxide using the silicon nitride as an oxidation mask.

17 Claims, 3 Drawing Sheets

U.S. PATENT DOCUMENTS

| | | | |
|---|---|---|---|
| 4,968,636 | 11/1990 | Sugawara | 438/423 |
| 5,077,230 | 12/1991 | Woo et al. | 437/43 |
| 5,091,323 | 2/1992 | Shinozawa | 438/341 |
| 5,128,274 | 7/1992 | Yabu et al. | 437/70 |
| 5,137,843 | 8/1992 | Kim et al. | 437/70 |
| 5,373,177 | 12/1994 | Kitaoka | 257/306 |

FOREIGN PATENT DOCUMENTS

| | | | |
|---|---|---|---|
| 62-115841 | 5/1987 | Japan . | |
| 0110658 | 5/1988 | Japan | 437/69 |
| 1-214142 | 8/1989 | Japan . | |
| 0024727 | 2/1991 | Japan | 437/69 |
| 144805 | 6/1993 | Japan . | |

OTHER PUBLICATIONS

T. Nishihara et al., A 0.5um Isolatio Technology Using Advanced Poly Silicon Pad LOCOS (APPL), IEDM Tech. Dig., 1998, pp. 100–103.

B. Davari et al., A Variable–Size Shallow Trench Isolation (STI) Technology with Diffused Sidewall Doping for Sub-micron CMOS, IEDM, pp. 92–95, 1988.

Dylewski et al., The Dielectric Breakdown Properties and I–V Characteristics of Thin $SiO_2$ Films Formed by High Dose Oxygen Ion Implantation into Silicon, Thin Solid Films, pp. 227–235, 1977.

Kirov et al., Properties of $SiO_2$ Films Formed by Oxygen Implantation into Silicon, Thin Solid Films, pp. 187–192, 1978.

P. Deroux–Dauphin et al., Physical and Electrical Characterization of a SILO Isolation Structure, IEEE Trans. on ED, vol. ED–32, No. 11, Nov. 1985, pp. 2392–2398.

B.Y. Mao et al., The Characteristics of CMOS Devices in Oxygen–Implanted Silicon–on–Insulator Structures, IEEE Trans. on ED, vol. 35, No. 5, May 1988, pp. 629–633.

P.L. Hemment, Silicon on Insulation Formed by $O^+$ or $N^+$ Ion Implantation, Mat. Res. Soc. Symp., vol. 53, pp. 207–221, 1986.

METHOD FOR SEMICONDUCTOR DEVICE ISOLATION USING OXYGEN AND NITROGEN ION IMPLANTATIONS TO REDUCE LATERAL ENCROACHMENT

NOTICE OF RELATED APPLICATIONS

The present application is a continuation-in-part of the application entitled A METHOD FOR SEMICONDUCTOR DEVICE ISOLATION USING OXYGEN ION IMPLANTATION TO REDUCE LATERAL ENCROACHMENT filed on Feb. 10, 1994, having Ser. No. 08/195,524 now ABN, and assigned to Micron Semiconductor.

FIELD OF THE INVENTION

The invention relates to methods and devices for electrically isolating active regions of a substrate and, more particularly, to modified local oxidation of silicon (LOCOS).

BACKGROUND OF THE INVENTION

In the formation of semiconductor devices, and specifically in the fabrication of semiconductor integrated circuits, an oxide layer, usually called a "field oxide," is used to isolate adjacent active devices. This is especially true with metal-oxide-semiconductor field effect transistor (MOSFET) circuits but is true of bipolar and other circuits as well.

Device isolation in the deep submicron region is one of the major obstacles faced by high density complementary metal oxide semiconductor (CMOS) technologies. Traditionally local oxidation of silicon (LOCOS) has been employed to electrically isolate active devices in the CMOS technologies. In the LOCOS process, field oxide is usually formed by a process in which an oxidation resistant material such as silicon nitride or a combination of silicon nitride with silicon oxide or other materials is formed on a semiconductor substrate overlying active device regions where transistors or other devices are to be formed. The substrate is then heated in an oxidizing ambient to grow a thermal oxide on those portions of the substrate not protected by the oxidation resistant material. Depending upon the oxide thickness a portion of the unprotected silicon is consumed during the formation of the thermal oxide.

There are a number of problems associated with the use of LOCOS. As the minimum feature sizes get below about 0.4 micrometers LOCOS can no longer be applied primarily due to encroachment concerns, which are typically 0.2 micrometers per side, and the related effects, including narrow-width effects which affect device performance. These problems are especially significant with newer circuits which utilize an ever increasing number of devices and in which the devices are of ever decreasing size, both in surface area and depth. As thermal oxides grow in thickness, they also grow laterally under the edge of the oxidation resistant material causing a lifting of the edge of the oxidation resistant material, and giving rise to what is known as "bird's beak." Thick field oxides thus use a considerable amount of lateral space and accordingly require an increase in the size of the circuit chip. This is especially true when the circuit involves a high density of integration. This "lateral encroachment" or "birds beak" also generates large stresses in the oxidation resistant material near the active area edges or corners, which can create dislocations in the active area regions resulting in higher junction leakage. These stress related defects, therefore, result in poor functionality when LOCOS is employed in addition to encroachment problems.

Various modifications to LOCOS which reduce the lateral encroachment have been proposed. Most of these techniques are complicated and hence add expense to the process flow. In addition to LOCOS other isolation approaches include trench and isolation by selective epitaxy. Articles by B. Davari et al., *A VARIABLE-SIZE SHALLOW TRENCH ISOLATION (STI) TECHNOLOGY WITH DIFFUSED SIDEWALL DOPING FOR SUBMICRON CMOS*, p. 92, IEDM 1988, which refers to the trench, and by Y. C. S. Yu et al., *NEW BIRD'S BEAK-FREE DEVICE ISOLATION TECHNOLOGY*, J. Electrochem. Soc, 135, p. 2562, 1988, which refers to epitaxy, are incorporated by reference to familiarize the reader with one level of knowledge of one skilled in the art.

Oxygen implants are used extensively in separation by implantation of oxygen (SIMOX) implementation of silicon-on-insulator (SOI) technology. These oxygen implants are carried out by implanting oxygen ions at high energy and doses into bare silicon wafers. A buried oxygen rich layer is formed, and extensive damage occurs. The oxygen is chemically bonded to silicon to form silicon oxide during high temperature annealing in nitrogen. This anneal step is also used to anneal out the damage created by the oxygen implantation. Investigators in the SOI area have also investigated low energy oxygen implants to create an oxide layer close to the Si surface. This method is described by J. Dylewski and M. C. Joshi in *FORMATION OF THIN $SiO_2$ FILMS BY HIGH DOSE OXYGEN ION IMPLANTATION INTO SILICON AND THEIR INVESTIGATION BY IR TECHNIQUES*, Thin Solid Films, v. 35, p. 327 (1976) and by K. I. Kirov, et al., *PROPERTIES OF $SiO_2$ FILMS FORMED BY OXYGEN IMPLANTATION INTO SILICON*, Thin Solid Films, v. 48, p. 187 (1978), which are herein incorporated by reference to familiarize the reader with one level of knowledge of one skilled in the art. It is shown in these articles that using a low energy ion implant can create a buried oxygen rich layer near the surface of the substrate.

In one LOCOS modification, described in patent 4,748,134, entitled ISOLATION PROCESS FOR SEMICONDUCTOR DEVICES, by Holland et al., halogen ions are implanted in order to enhance the oxide growth rate in the vertical direction compared to the lateral direction. In some experiments conducted by the inventors of U.S. Pat. No. 4,748,134 for sequential energies and doses of 160 keV/1× $10^{16}/cm^2$, 85 keV/6.4×$10^{15}/cm^2$, and 40 keV/3.5 ×$10^{15}/cm^2$, it was found that implanting oxygen ions into the substrate resulted in "only a negligible increase in thickness" of the field oxide, see Example 1 which starts on line 16 in column 4. The Claims of U.S. Pat. No. 4,748,134 are directed to halogen implants for increasing the growth rate of oxide in a vertical direction relative to the growth rate in a lateral direction.

Because of the foregoing and other problems associated with the conventional formation of isolating thermal oxides, there exists a need for an improved process.

SUMMARY OF THE INVENTION

The invention is a method wherein oxygen ions and nitrogen ions are implanted prior to a thermal oxide growth to form a localized oxide isolation region. The oxygen ions are implanted in the substrate at a dose and energy sufficient to form an oxygen rich layer close to the substrate surface. The implanted oxygen provides an internal supply of oxygen to enhance the effective silicon oxidation rate, which in turn will reduce the required oxidation time at a given temperature and reduce lateral oxide encroachment during the thermal oxide growth.

The nitrogen ions are implanted at an angle such that a nitrogen rich region is formed in the substrate adjacent to the desired oxide isolation region. The nitrogen rich region is conducive to preventing lateral oxide encroachment during the thermal oxide growth.

The oxygen implant of the present invention is performed at an energy controlled to create a layer of oxygen rich silicon in the substrate which effectively enhances the thermal oxidation rate of the substrate. Typically, the energy of the ion implant is selected such that the layer of oxygen rich silicon is formed in the substrate adjacent to the surface of the substrate.

In accordance with one embodiment of the invention, a silicon substrate is selectively masked with silicon nitride over silicon dioxide. Next oxygen ions are implanted into the unmasked regions of the substrate at an energy necessary to form a layer of oxygen rich silicon in the substrate adjacent to the surface of the substrate. Finally the substrate is thermally oxidized using the silicon nitride as an oxidation mask.

The method of the invention is a simple and inexpensive approach for forming a localized oxide isolation region for deep submicron applications.

DETAILED DESCRIPTION

FIGS. 1–4 illustrate process steps in accordance with one embodiment of the invention. In this embodiment, localized oxide regions are formed, for example, for isolation between semiconductor devices, such as between adjacent devices in MOS integrated circuits although the oxide may also be used in bipolar circuits, within a discrete device, or in other similar application.

Figure 1:
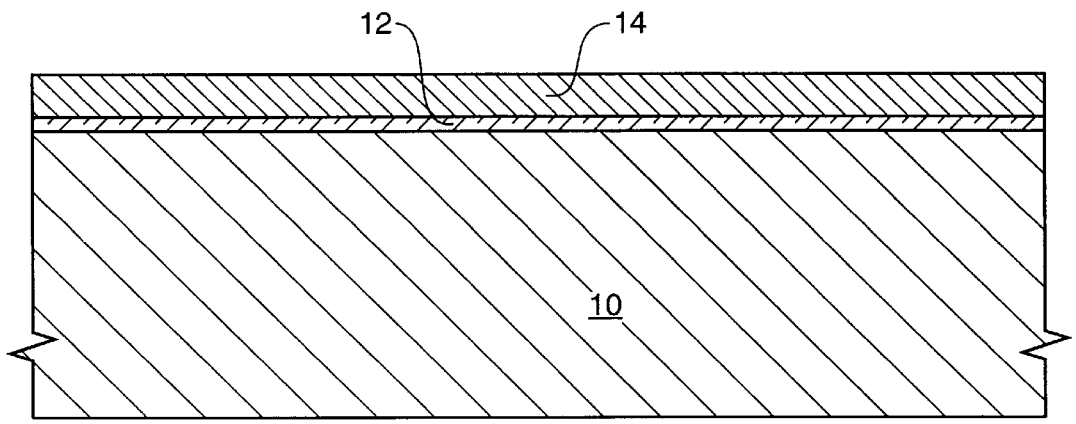
FIG. 1 is a cross-sectional view of a portion of a semiconductor substrate and two overlying oxidation resistant layers.

FIG. 1 illustrates, in cross-section, a portion of a semiconductor substrate 10 in which it is desired to form a plurality of active regions which are isolated by localized oxide regions. Overlying the surface of substrate 10 is an oxidation resistant stack. In the illustrative embodiment the oxidation resistant stack includes a thin layer 12 of silicon dioxide and an overlying layer 14 of silicon nitride which provides the oxidation resistance. Alternate oxidation resistant materials may be used or alternate combinations of materials may be used as the oxidation resistant stack. These alternate materials are well known to those skilled in the art. For example, the oxidation resistant material can be a stack of nitride, polysilicon, and oxide where the polysilicon is used as buffer layer between the nitride and oxide to reduce stress.

Figure 2:
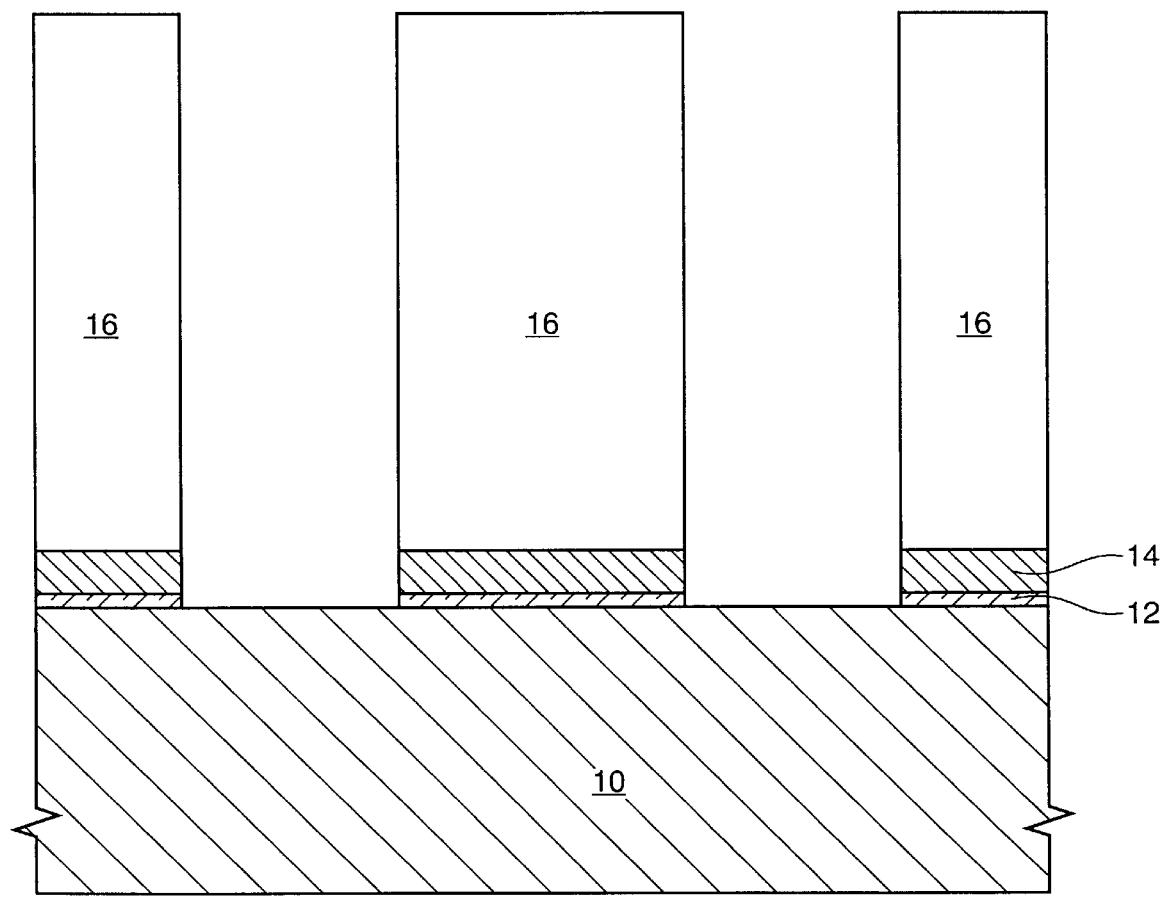
FIG. 2 is the cross-sectional view of FIG. 1 following the deposition and patterning of a photoresist layer and underlying oxidation resistant materials.

The process continues by patterning the oxidation resistant material to leave that material overlying only the active device portions of the substrate. As illustrated in FIG. 2, the patterning of the oxidation resistant material is accomplished by applying and photolithographically patterning a layer of photoresist to form photoresist regions 16 overlying what will become the active regions in which the devices are to be formed. FIG. 2 shows three such regions, although the number, location, and shape of these regions will depend upon the device being fabricated. Patterned photoresist 16 is used in conventional manner to pattern the underlying layers of silicon nitride 14 and silicon dioxide 12. The patterning of the oxidation resistant material is done in a manner suitable for the technology and is not critical to the practice of the invention. The patterning exposes selected portions of the substrate surface. Not all of the layers must be removed; silicon dioxide layer 12, for example, may be left on the surface. In this context, "exposes" is meant to encompass either option and is not limited to removing all layers to obtain a bare surface.

Figure 3:
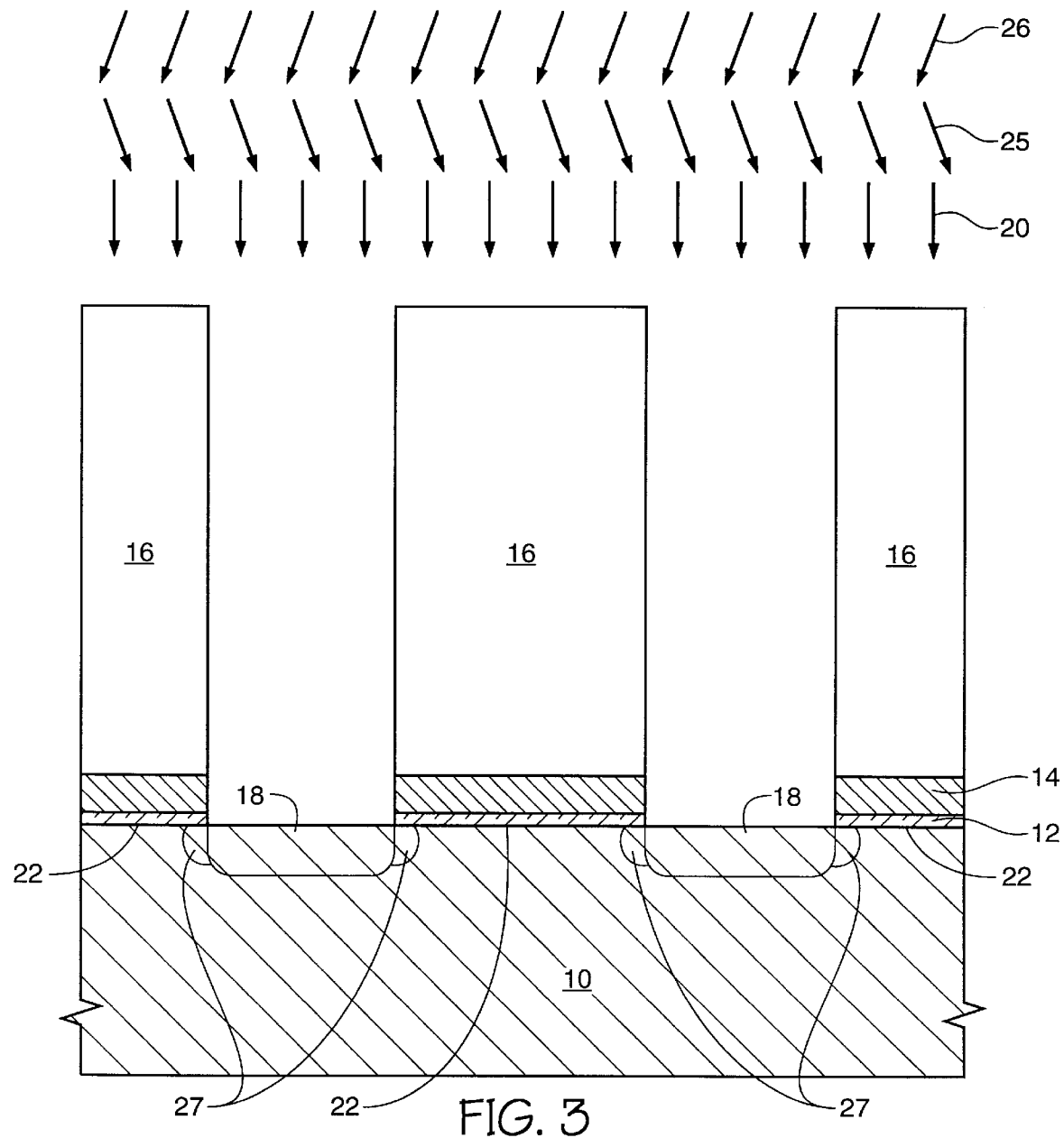
FIG. 3 depicts the oxygen ion and nitrogen bombardments of the layers shown in FIG. 2.

In accordance with the invention oxygen ions are implanted selectively into the surface of substrate 10 as illustrated in FIG. 3. The ions are selectively implanted into the substrate surface using the patterned oxidation resistant materials 12, 14, and preferably also the patterned photoresist 16 as an ion implantation mask. In a preferred embodiment of the invention the oxygen ions have an energy less than 50 keV and a dose greater than $1 \times 10^{16}/cm^2$. Each implanted region 18 is a layer of oxygen rich silicon, and each implanted region 18 is formed at the substrate surface in those locations where field oxide is to be formed. Other energies and doses may be used if they are selected to form the oxygen rich silicon layer at the substrate surface or close enough to the surface such that the ion implantation enhances thermal oxidation. The implantation of oxygen ions, as illustrated by arrows 20, is an anisotropic process so that the location of ions in the substrate is limited in lateral extent by the masking layers 12, 14, 16. In this and the following discussion the terms lateral and vertical are referenced to the major surface 22 of substrate 10 and represent directions parallel and perpendicular thereto, respectively. Because of the anisotropic nature of the ion implantation process, implanted regions 18 are aligned with the openings in the implant mask with only minor extension (due to scattering and the like) of ions laterally underneath the masking layer.

In addition to the oxygen ion implant an angled nitrogen ion implant is performed at an energy of between 25–40 keV, including endpoints, and a total dose between $1 \times 10^{12}$ and $1 \times 10^{15}$ cm$^{-2}$, including endpoints. Typically the wafer is rotated 360 degrees in 90 degree increments in order to implant the nitrogen into the substrate in all of the masked areas surrounding the implanted region 18, however the implant is shown in FIG. 3 with arrows 25 and 26 to show the result of the implant cross sectionally. Typically the oxygen and nitrogen implants are performed independently. However, it is a designers choice as to the order in which the implants are performed. The angled nitrogen ion implant has an implant angle of between greater than 0 degrees and less than or equal to 30 degrees. It is important to consider the height of the photoresist mask and implant angle. The implant angle and height must be chosen in order that the photoresist mask is capable of blocking nitrogen penetration in the substrate in the proposed field oxide region. The implant angle is the angle formed between a vertical to the substrate and a direction of an ion being implanted. The angled nitrogen implant forms nitrogen rich silicon regions 27, in the case where the substrate is silicon, underlying the oxidation resistant material at the edges thereof. The nitrogen rich silicon regions 27 reduce lateral encroachment of localized field oxide into the substrate underlying the masking layers 12, 14, 16.

If necessary, in portions of the wafer, such as the periphery, where the implant is not desired or where an exposed area is too large for the photomask to shield exposed portions of the substrate from the nitrogen implant, an additional photoresist mask may be used during the formation of the nitrogen rich regions in array portions of the memory device.

Figure 4:
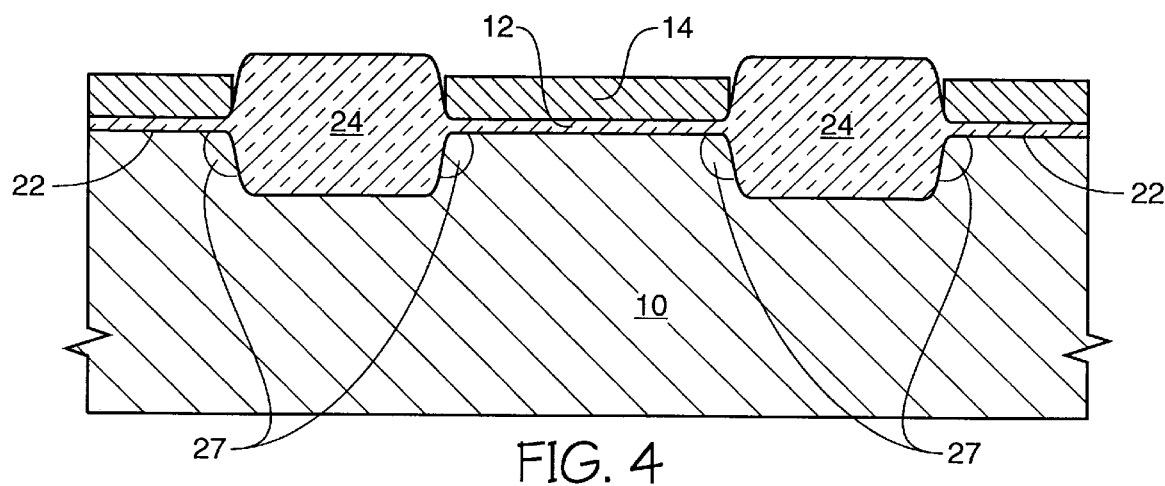
FIG. 4 is the cross-sectional view of FIG. 3 following the removal of the photoresist and the thermal oxidation of the substrate in isolation areas.

After removing photoresist layer of 16, the exposed portions of substrate 10 are heated in an oxygen ambient to grow localized field oxide regions 24 as illustrated in FIG. 4. In a preferred embodiment the temperature during thermal oxidation is 950 degrees centigrade. The thermal oxidation time is adjusted in order to control the thickness of the field oxide regions 24. It is well known that the thermal oxidation process causes field oxide 24 to be partially recessed below the original surface 22.

Since the thermal oxidation of silicon is a diffusion controlled process, the rate of oxide growth is limited by the diffusion of the oxidizing species through the growing oxide film. By forming an oxygen rich layer near the surface of the substrate we believe the oxygen rich layer functions as an internal oxygen source during the subsequent field oxidation to enhance the oxidation rate vertically. Thus the internal source of oxygen in the implanted regions 18 formed during the oxygen ion implant will cause an enhanced oxide growth rate resulting in a reduced lateral encroachment of the field oxide regions 24 into the active areas. Thus the implanted regions 18 are formed in order to control the lateral dimension of the field oxide regions 24 formed during thermal oxidation.

Although a specific embodiment has been described the invention should be read as limited only by the claims.

What is claimed is:

1. A method for creating an electrical isolation region in a substrate having a planar surface, the method comprising:
   exposing the planar surface of the substrate over the entire extent of an isolation area such that the surface of the isolation area remains at the level of adjoining areas of the surface;
   introducing oxygen ions into the substrate in the isolation area;
   introducing nitrogen entirely through the planar substrate surface of the isolation area into the portion of the substrate region surrounding and adjacent the isolation area while the entire area of the isolation area remains exposed;
   growing a field oxide in the substrate in the isolation area.

2. The method of claim 1 where introducing the nitrogen comprises implanting nitrogen ions into the substrate through a only a portion of the exposed planar substrate surface.

3. The method of claim 2 where the nitrogen ions are implanted only near the edge of the isolation area of the exposed planar substrate.

4. The method of claim 3 where the nitrogen ions are implanted at an acute angle to the surface of the substrate.

5. The method of claim 4 further comprising rotating the substrate while the nitrogen ions are being implanted.

6. The method of claim 1 where introducing the oxygen ions comprises implanting them into the substrate over the entire isolation area.

7. The method of claim 6 where the oxygen ions are implanted at right angles to the surface of the substrate.

8. A method for reducing lateral encroachment in isolation devices formed in a substrate having a surface, the method comprising:
   defining a number of isolation areas on the substrate for the isolation devices;
   exposing the surface of the substrate in the isolation areas without lowering the substrate surface below the level of adjoining areas of the substrate;
   introducing oxygen ions into the substrate over the isolation areas;
   introducing nitrogen ions through edges of the isolation areas into the portion of the substrate adjacent to and surrounding the edges of the isolation areas without maintaining a mask on the isolation areas; and
   growing field-oxide isolation regions in the isolation areas.

9. The method of claim 8 wherein introducing the oxygen ions comprises implanting them so as to form oxygen-rich regions over the isolation areas.

10. The method of claim 9 where the energy of the oxygen ions is less than 50 keV and where the dosage is greater than $10^{16}$ per $cm^2$.

11. The method of claim 8 where introducing the nitrogen ions comprises implanting them so as to form nitrogen-rich regions adjacent to and surrounding the oxygen rich area near the edges and extending below the level of the substrate surface of the isolation areas.

12. The method of claim 11 where the energy of the nitrogen ions lies between 25 and 40 keV and where the dose lies between $10^{12}$ and $10^{16}$ per $cm^2$.

13. A method for fabricating an integrated circuit in a substrate, comprising:
   forming a first layer of oxidation-resistant material over a planar surface of the substrate;
   depositing a second layer of masking material over the first layer;
   defining multiple isolation areas in the masking material;
   exposing the planar surface of the substrate in the isolation areas;
   implanting oxygen ions into the exposed planar surface of the substrate so as to form oxygen-rich regions in the substrate in at least the central portions of the isolation areas;
   implanting nitrogen ions into the exposed planar surface of the substrate through at least the edges of the central portions of the isolation areas so as to form nitrogen-rich regions in the substrate in the peripheral portions of the isolation areas;
   heating the substrate so as to form the isolation regions in at least the central portions of the isolation areas.

14. The method of claim 13 where the nitrogen ions are implanted at an acute angle to the exposed surface of the isolation areas.

15. The method of claim 14 where the acute angle is sufficiently small that the first and second layers block the nitrogen ions from the central portions of the isolation areas.

16. The method of claim 13 where the oxygen and nitrogen ions are implanted at different angles.

17. The method of claim 16 where the oxygen ions are implanted perpendicular to the planar surface of the substrate.

* * * * *